(12) United States Patent
Li et al.

(10) Patent No.: US 12,376,377 B2
(45) Date of Patent: Jul. 29, 2025

(54) ARRAY SUBSTRATE, MANUFACTURING METHOD THEREOF, AND DISPLAY PANEL

(71) Applicant: BOE TECHNOLOGY GROUP CO., LTD., Beijing (CN)

(72) Inventors: Dong Li, Beijing (CN); Xiaolong Li, Beijing (CN); Liangjian Li, Beijing (CN); Hongwei Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/116,689

(22) Filed: Mar. 2, 2023

(65) Prior Publication Data

US 2023/0207578 A1 Jun. 29, 2023

Related U.S. Application Data

(63) Continuation of application No. 16/643,233, filed as application No. PCT/CN2019/071347 on Jan. 11, 2019, now abandoned.

(51) Int. Cl.
*H10D 86/40* (2025.01)
*H10D 86/01* (2025.01)
(Continued)

(52) U.S. Cl.
CPC ......... *H10D 86/451* (2025.01); *H10D 86/021* (2025.01); *H10D 86/441* (2025.01);
(Continued)

(58) Field of Classification Search
CPC ............... H01L 27/1248; H01L 27/124; H01L 27/1259; H01L 27/1255; H10K 59/131; H10K 59/124
(Continued)

(56) References Cited

U.S. PATENT DOCUMENTS 8,933,451 B2 1/2015 Kim et al.
2002/0028411 A1 3/2002 Park et al.
(Continued)

FOREIGN PATENT DOCUMENTS

CN 103325792 A 9/2013
CN 107658333 A 2/2018
(Continued)

OTHER PUBLICATIONS

First non-final office action of U.S. Appl. No. 16/642,233, dated Nov. 1, 2021.
(Continued)

*Primary Examiner* — Ori Nadav
(74) *Attorney, Agent, or Firm* — Chiwin Law LLC (57) ABSTRACT

An array substrate and a manufacturing method thereof are provided. The array substrate includes a display pixel area for providing pixel units arranged in an array. The array substrate further includes: a base substrate, a first insulating layer, a second insulating layer, and a first conductive pattern layer. The first insulating layer is provided on the base substrate, grooves are provided in the first insulating layer, and the grooves are provided in the display pixel area. The second insulating layer is provided on the first insulating layer, and the second insulating layer is also filled into the grooves. The first conductive pattern layer is provided on the second insulating layer. By providing the grooves, the array substrate may have better impact resistance and bending resistance.

19 Claims, 4 Drawing Sheets

(51) Int. Cl.
*H10D 86/60* (2025.01)
*H10K 59/124* (2023.01)
*H10K 59/131* (2023.01)
*H10K 59/12* (2023.01)

(52) U.S. Cl.
CPC ........... *H10D 86/60* (2025.01); *H10K 59/124* (2023.02); *H10K 59/131* (2023.02); *H10D 86/481* (2025.01); *H10K 59/12* (2023.02)

(58) Field of Classification Search
USPC .......................................................... 257/71
See application file for complete search history.

(56) References Cited

U.S. PATENT DOCUMENTS

| | | |
|---|---|---|
| 2015/0084073 A1 | 3/2015 | Yamada et al. |
| 2017/0141276 A1 | 5/2017 | Yamada et al. |
| 2018/0315809 A1 | 11/2018 | Kim et al. |
| 2020/0035775 A1 | 1/2020 | Kim et al. |
| 2020/0035776 A1 | 1/2020 | Kim et al. |
| 2020/0152904 A1 | 5/2020 | Xu et al. |
| 2021/0202533 A1 | 7/2021 | Kim et al. |

FOREIGN PATENT DOCUMENTS

| | | |
|---|---|---|
| CN | 108598113 A | 9/2018 |
| CN | 109166896 A | 1/2019 |

OTHER PUBLICATIONS

Final office action of U.S. Appl. No. 16/642,233, dated Feb. 3, 2022.
Second non-final office action of U.S. Appl. No. 16/642,233, dated Aug. 18, 2022.
ISR and Written Opinion of PCT/CN2019/071347 in Chinese & English, dated Oct. 10, 2019.

ARRAY SUBSTRATE, MANUFACTURING METHOD THEREOF, AND DISPLAY PANEL

The present application is a continuation application of U.S. patent applicant Ser. No. 16/643,233 filed on Feb. 28, 2020, which is a U.S. National Phase Entry of International Applicant No. PCT/CN2019/071347 filed Jan. 11, 2019. The above-identified applications are incorporated by reference herein in their entirety.

TECHNICAL FIELD

Embodiments of the present disclosure relate to an array substrate, a manufacturing method thereof, and a display panel.

BACKGROUND

In the display field, an organic light-emitting diode (OLED) display panel has characteristics of self-luminous, high contrast, low energy consumption, wide viewing angle, fast response speed, applicability to flexible panels, wide service ability temperature range, easy manufacturing, etc., and has broad prospects of development. With the development of flexible electronic technology, flexible display devices with foldable performance are increasingly favored by people. For example, in order to achieve narrow bezel or even bezel-free display, a non-display area of the display device may be bent. Alternatively, for the sake of portability, the display device may also be fold. How to optimize the manufacturing process of the display panel is a concern in the field.

SUMMARY

Some embodiments of the present disclosure provide an array substrate including a display pixel area for providing pixel units arranged in an array. The array substrate further includes a base substrate; a first insulating layer, a second insulating layer and a conductive pattern layer. The first insulating layer is provided on the base substrate, and the grooves are provided in the first insulating layer and in the display pixel area; the second insulating layer provided on the first insulating layer, and the second insulating layer is further filled into the grooves; and the first conductive pattern layer is provided on the second insulating layer.

In at least one example, the second insulating layer is an organic insulating layer.

In at least one example, the grooves expose the base substrate.

In at least one example, the first conductive pattern layer includes a gate line or a portion of the gate line for the display pixel area.

In at least one example, the grooves include a first portion that is parallel to the gate line or overlaps the gate line in a direction perpendicular to the base substrate.

In at least one example, the pixel unit includes a first transistor, the first transistor includes a first gate electrode, and the first gate electrode is on the side of the second insulating layer adjacent to the base substrate, and the first gate electrode is electrically connected to the gate line through a first via in the second insulating layer.

In at least one example, the array substrate further includes a gate connection electrode located between the second insulating layer and the first conductive pattern layer, and the first gate electrode is electrically connected to the gate line through the gate connection electrode.

In at least one example, the first transistor further includes a first source electrode and a first drain electrode, and the first source electrode and the first drain electrode are disposed on the same layer as the gate connection electrode and are made of the same material.

In at least one example, the array substrate further includes a data line for the display pixel area, and the data line and the first source electrode and the first drain electrode are disposed on the same layer and are made of the same material. The grooves further include a second portion that is parallel to the data line or overlaps the data line in a direction perpendicular to the base substrate.

In at least one example, the pixel unit further includes a second transistor, and the second transistor includes a second gate electrode, and the second gate electrode is connected to a first source electrode or a first drain electrode of the first transistor.

In at least one example, the grooves are distributed around the second gate electrode.

In at least one example, the grooves further include a third portion, and the third portion is arranged in parallel with the second gate electrode and corresponding to the second gate electrode. In a length direction of the third groove, a length of the third portion is greater than a length of the second gate electrode.

In at least one example, the second transistor comprises a second source electrode and a second drain electrode, and in a direction perpendicular to the base substrate, the second source electrode and the second drain electrode are located between the second insulating layer and the first conductive pattern layer In at least one example, the array substrate further includes a third insulating layer, and in a direction perpendicular to the base substrate, the third insulating layer is located between the first conductive pattern layer and the second source electrode as well as the second drain electrode.

In at least one example, the array substrate further includes a fourth insulating layer and a pixel electrode laminated on the first conductive pattern layer. The second source electrode or the second drain electrode is electrically connected to the pixel electrode through a second via in the fourth insulating layer.

In at least one example, the first conductive pattern layer further includes a driving connection electrode, and the second source electrode or the second drain electrode is connected to the pixel electrode through the driving connection electrode.

In at least one example, the array substrate further includes a first capacitor electrode. In a direction perpendicular to the base substrate, the first capacitor electrode is disposed between the first insulating layer and the second insulating layer.

In at least one example, the array substrate further includes a second capacitor electrode, and the second capacitor electrode is provided on the same layer as the first gate electrode and directly faces the first capacitor electrode to form a capacitor.

Some embodiments of the present disclosure further provide a display panel including the above-mentioned array substrate.

Some embodiments of the present disclosure further provide a method for manufacturing an array substrate. The array substrate includes a display pixel area for providing pixel units arranged in an array, and the manufacturing method includes: providing a base substrate; forming a first insulating layer on the base substrate, and forming grooves on the first insulating layer, the grooves being formed in the display pixel area; forming a second insulating layer on the first insulating layer, and the second insulating layer is further filled into the grooves; and forming a first conductive pattern layer on the second insulating layer.

In at least one example, the first insulating layer is an organic insulating layer.

In at least one example, forming the first conductive pattern layer includes forming a gate line for the display pixel area or forming a portion of the gate line.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An array substrate used for a display device or an electronic device comprising the display device is prone to be damaged under external stress. In addition, with the development of technology and changes in consumers' demands, manufacturers launch flexible electronic devices with foldable display screens. For example, the flexible electronic device includes a flexible substrate and various circuit structures and electronic devices prepared on the flexible substrate. As needed, some parts of the flexible electronic device (such as a display area, a pad area, etc.) can be folded and fixed, or bent during use according to needs to adjust a positional relationships between different parts (such as mobile phones with multi-screen). Due to the bending stress, layer structures on the base substrate are prone to break and fall off, thereby causing a risk of a failed structure of the device.

Some embodiments of the present disclosure provide an array substrate which includes a base substrate and a display pixel area. The display pixel area is used to provide pixel units arranged in an array, and includes: a first insulating layer, a second insulating layer, and a first conductive pattern layer. The first insulating layer is provided on the base substrate, and grooves provided in the first insulating layer. The second insulating layer is provided on the first insulating layer, and the second insulating layer is further filled into the groove. The first conductive pattern layer is provided on the second insulating layer.

In some embodiments of the present disclosure, a contact area between the second insulating layer and the first insulating layer may be increased by providing the groove in the first insulating layer in a display pixel area of the array substrate and by filling the second insulating layer in the groove, thereby releasing the internal stress in the second insulating layer which is liable to cause fracture during bending the array substrate, and enabling the strain under the stress to mainly occur in the groove area (strain absorption region). Additionally, in a case where the array substrate is bent and a crack occurs in a laminated structure of the array, the groove can also prevent the crack from extending. Therefore, the arrangement in the above embodiments of the present disclosure may reduce or eliminate the risk of the second insulating layer and the structures thereon (such as the first conductive pattern layer) falling off during the bending of the array substrate, and improve the impact resistance and bending resistance of the device in the display pixel area of the array substrate, and therefore improves the performance and yield of the product.

It should be noted that the groove structure refers to a structure provided according to needs, which is different from an uneven surface structure which cannot be avoided in a conventional manufacturing method, and is also different from a via structure which serves as a connection.

Figure 1:
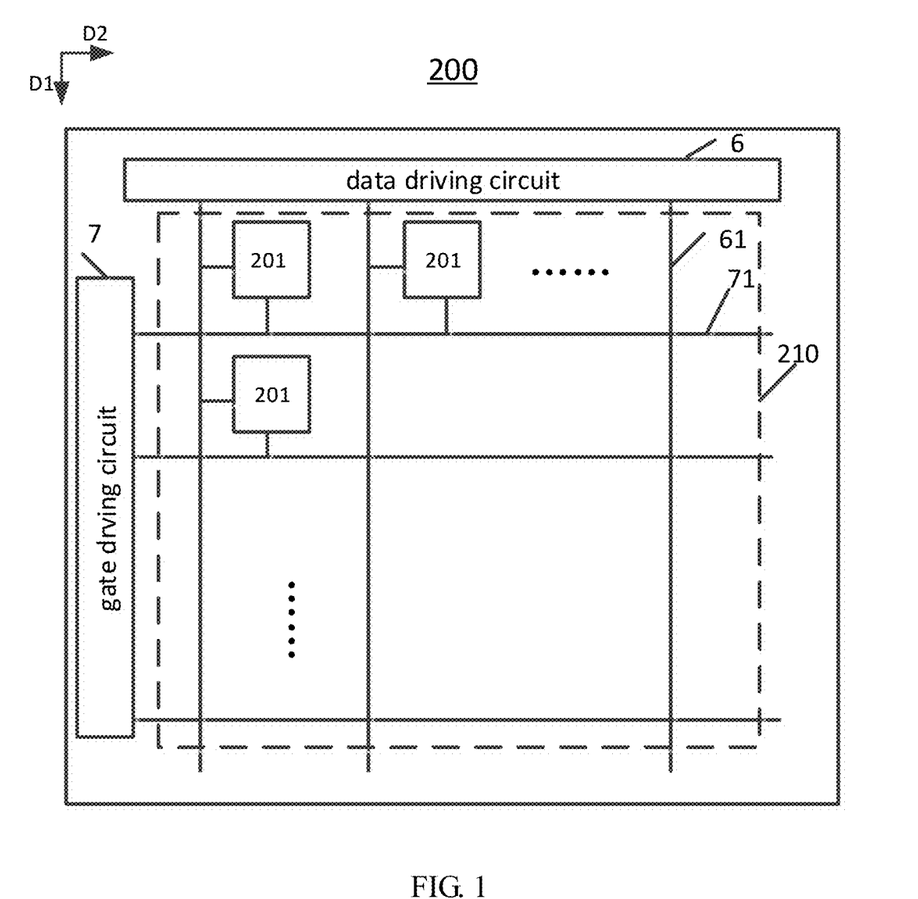
FIG. 1 is a schematic plan diagram of an array substrate provided by an embodiment of the present disclosure.

FIG. 1 is a schematic plan diagram of an array substrate provided by some embodiments of the present disclosure. As shown in the figure, the array substrate 200 includes a display pixel area 210. The display pixel area 210 is used to provide a plurality of pixel units 201 arranged in an array. The array substrate further includes a plurality of gate lines 71 extending in a first direction D1 and a plurality of data lines 61 extending in a second direction D2. The plurality of gate lines and the data lines define a plurality of pixel regions by crossing each other. A plurality of pixel units 201 are distributed in the plurality of pixel regions in a one-to-one correspondence.

For example, the array substrate may further include a data driving circuit 6 and a gate driving circuit 7. The data driving circuit is configured to provide data signals for the pixel unit 201, and the gate driving circuit is configured to provide scanning signals to the pixel unit 201. In addition, the array substrate may further include other circuits or devices for further providing other control signals of various kinds. The data driving circuit and the gate driving circuit are connected to the pixel unit 201 through a data line 61 and a gate line 71, respectively. Each pixel unit 201 is connected to the gate line 71, the data line 61, and the like to receive a corresponding electric signal to emit light and realize display operations.

For example, the array substrate may be an organic light emitting diode (OLED) array substrate or an array substrate for a liquid crystal display. The embodiments of the present disclosure are described in detail below by taking the array substrate as an organic light emitting diode array substrate for example, but the embodiments of the present disclosure are not limited thereto.

For example, each pixel unit 201 includes a light emitting element (i.e., an OLED) and a pixel circuit which drives the light emitting element to emit light. For example, the pixel circuit may include a conventional 2T1C pixel circuit, that is, including two transistors and a capacitor. One of the two transistors is a switching transistor and the other is a driving transistor. As another example, the pixel circuit may also be a pixel circuit in other structures, such as a 3T1C, which is based on the aforementioned 2T1C pixel circuit or a pixel circuit further including a compensation function, a reset function, etc., which is not limited in the embodiments of the present disclosure.

Figure 2:
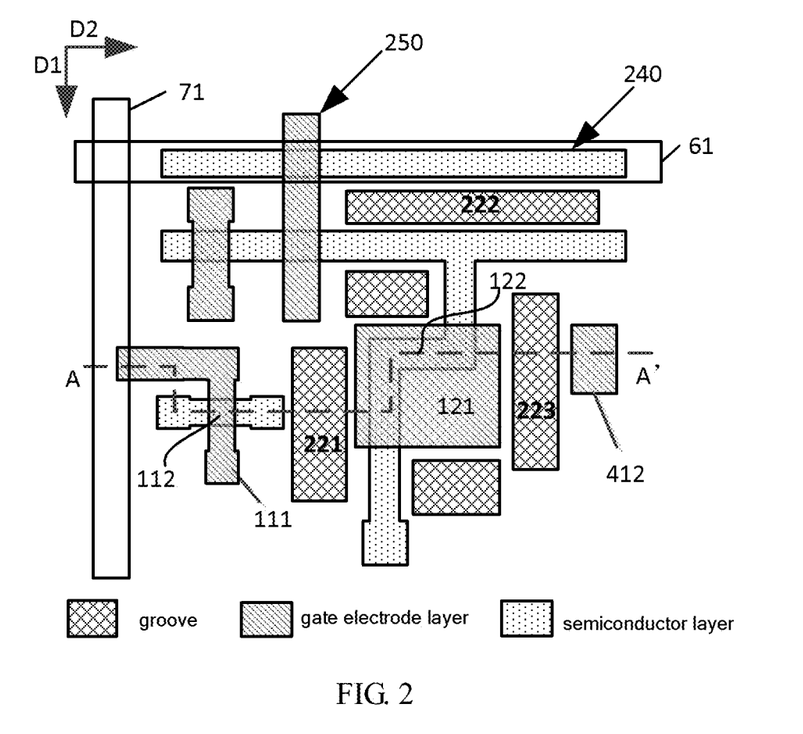
FIG. 2 is a partially enlarged schematic diagram of an array substrate provided by an embodiment of the present disclosure.
Figure 3:
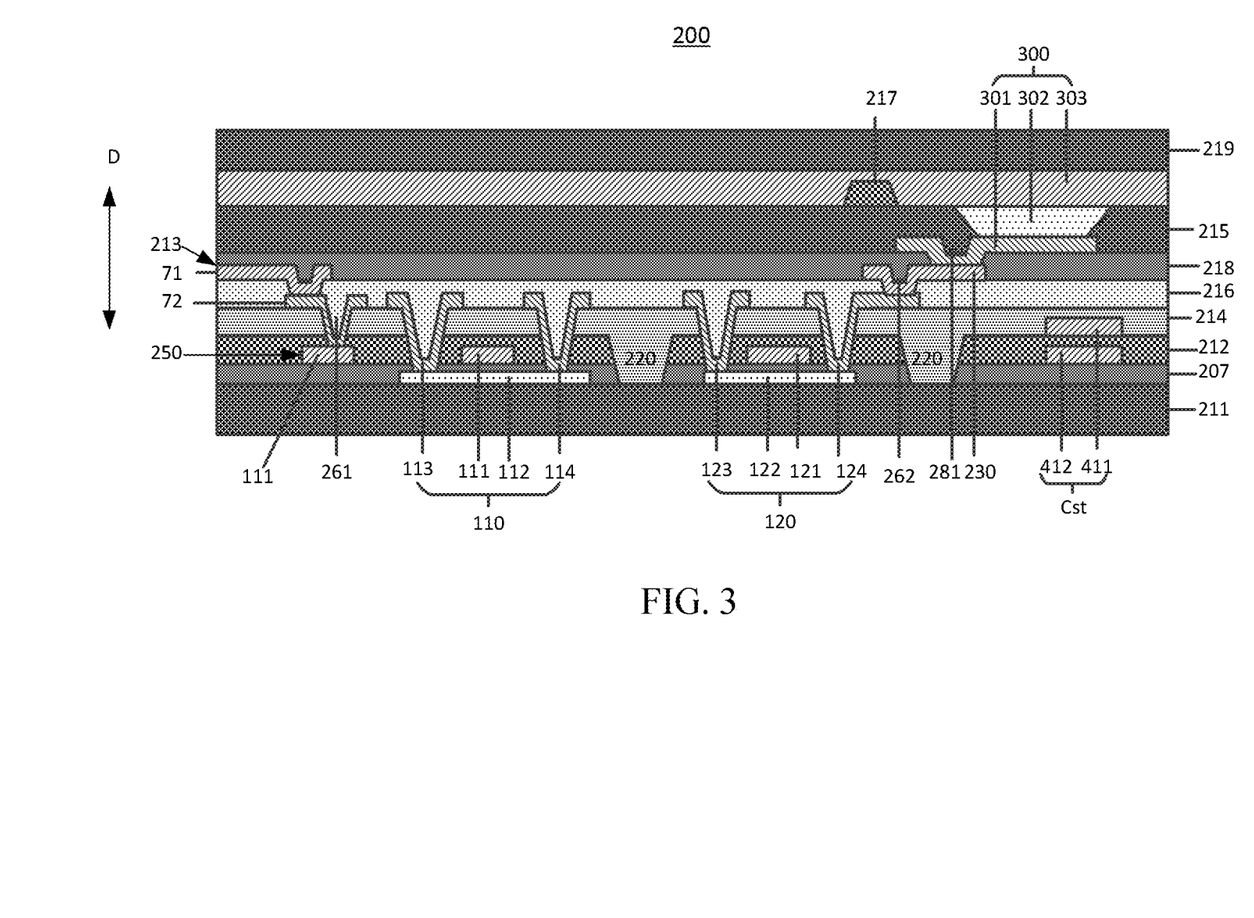
FIG. 3 is a schematic cross-sectional view taken along a section line A-A' of FIG. 2.

FIG. 2 is a partially enlarged schematic view of a layout of a pixel unit in an array substrate according to a specific example of an embodiment. FIG. 3 is a schematic cross-sectional view taken along a section line A-A' of FIG. 2. For the sake of clarity, FIG. 2 only illustrates the semiconductor layer 240, the gate electrode layer 250, and the groove areas in the array substrate, and schematically illustrates the gate line 71 and the data line 61. FIG. 3 only illustrates the light emitting element 300, the first transistor 110 and the second transistor 120 in the pixel unit. For example, the first transistor 110 is a switching transistor, which mainly functions as a switch and controls the transmission of data signals under the control of the gate line 71. The second transistor 120 is a driving transistor, which mainly functions as a driver and provides a driving current for a pixel electrode serving as a cathode or an anode of the light emitting element.

It should be noted that the embodiments of the present disclosure do not limit the specific connection methods among the first transistor, the second transistor, and the light emitting element.

Referring to FIG. 2 and FIG. 3, the array substrate 200 includes a base substrate 211 and a first insulating layer 212, a second insulating layer 214, and a first conductive pattern layer 213 which are sequentially laminated on the base substrate 211. Grooves 220 are provided in the first insulating layer 212, and the grooves 220 are provided in the display pixel area 210; and the second insulating layer 214 is filled in the grooves 220. As a further example, the second insulating layer 214 may have a flat surface for planarization.

For example, the second insulating layer 214 is an organic insulating layer. The organic insulating material has better flexibility than an inorganic insulating material, so that an impact resistance and bending resistance of the array substrate 200 can be further improved.

For example, the material of the second insulating layer 214 comprises at least one selected from the group consisting of polymethyl methacrylate, polycarbonate, polystyrene, epoxy resin, polyimide, and polyethylene.

For example, the first insulating layer 212 may be an organic insulating material, such as resin materials like polyimide. It can also be an inorganic insulating material, such as silicon oxide, silicon nitride, silicon oxynitride or metal oxide insulating materials.

For example, a material of the first conductive pattern layer 213 may include gold (Au), silver (Ag), copper (Cu), aluminum (Al), molybdenum (Mo), magnesium (Mg), tungsten (W), and alloy materials composed of the above metals, or conductive metal oxide materials, such as indium tin oxide (ITO), indium zinc oxide (IZO), zinc oxide (ZnO), zinc aluminum oxide (AZO), and the like.

For example, the groove 220 may be disposed in any location, where no via hole is provided, in the first insulating layer 212. Embodiments of the present disclosure don not limit the area for providing the groove 220, as long as a formation of devices structure is not affected. For example, in at least one embodiment, the groove 220 may be extended downward until the base substrate 211 is exposed, that is, a surface of the base substrate 211 is exposed through the groove 220.

For example, the present disclosure does not limit a planar shape of the groove 200 in a direction parallel to the base substrate 211. The shape includes a circle, a triangle, a rectangle, an oval, a T-shape, a strip, and a zigzag, or other shapes defined by structures of the peripheral devices. For example, a length direction of the groove 220 is parallel to a bending axis (not shown) of the array substrate 200, so that when the array substrate 200 is bent along the bending axis, the bending resistance of the array substrate 200 can be improved.

In at least one embodiment, for example, as shown in FIG. 2, at least a portion of the grooves 220 are distributed around the second transistor 120 with respect to a plane where the base substrate is located. For example, the grooves 220 are distributed around a second gate electrode 121 of the second transistor 120, that is, each of the four sides of the second gate electrode 121 is distributed with at least a portion of the grooves 220 second gate electrode. For example, the grooves 220 are provided on at least two sides of the second gate electrode 121. For example, on the base substrate. An extending direction of the groove 220 and an extending direction of the second gate electrode 121 are parallel to each other.

In the present embodiment, the second transistor 120 is used as a driving transistor of the pixel unit. Generally, the driving transistor occupies a relatively large area in the pixel unit, and its performance has a more important impact on the display effect compared with the switching transistor. Therefore, it is also very important to maintain a stability of the performance of the driving transistor. The above-mentioned arrangement is able to effectively protect the second transistor 120 from being easily damaged by external force or bending.

For example, as shown in FIG. 2, with respect to the plane where the base substrate is located, at least a portion of the grooves 220 may be further disposed between the first transistor 110 and the second transistor 120. For example, at least a portion of the grooves 220 can be disposed between a first active layer 112 of the first transistor 110 and a second active layer 122 of the second transistor 120. Alternatively, at least a portion of the grooves 220 can be disposed between the first gate electrode 111 of the first transistor 110 and the second gate electrode 121 of the second transistor 120.

For example, the first conductive pattern layer 213 includes a gate line 71 or a portion of the gate line 71 configured for the display pixel area 210. The gate line 71 is provided on a side of the second insulating layer 214 away from the base substrate 211. Therefore, a provision of the grooves 220 is not restricted by the gate line 71, and a position for providing the grooves 220 can be more flexible and an area of providing the grooves 220 can be larger.

The first insulating layer 212 and the second insulating layer 214 are sequentially laminated between the base substrate 211 and the first conductive layer 213. The arrangement may be laid out according to a specific array substrate structure, and not limited to a specific insulating layer structure.

For example, the second insulating layer 214 is an organic insulating layer closest to the base substrate 211. In the case where the groove 220 exposes the base substrate 211, this arrangement enables all the insulating materials corresponding to the position of the groove 220 in the direction perpendicular to the base substrate 211 to be organic insulating materials. Therefore, the impact resistance and bending resistance of the array substrate 200 can be improved.

For example, the grooves 220 include a first portion 221 which is parallel to the gate line 71 (as in FIG. 2) or overlaps the gate line 71 in a direction perpendicular to the base substrate 211. For example, a length direction of the first portion 221 is parallel to an extension direction of the gate line. It should be noted that the extension of the pattern in the present disclosure is not limited to extending along a straight line, but may be also extending along a curve, such as a serpentine extension.

For example, the gate electrode layer 250 includes the first gate electrode 111 of the first transistor 110.

For example, the gate electrode layer 250 further includes the second gate electrode 121 of the second transistor 120.

For example, the semiconductor layer 240 is located on a side of the gate electrode layer 250 close to the base substrate 211 and includes a first active layer 112 of the first transistor 110 and a second active layer 122 of the second transistor 120.

For example, as shown in FIG. 2, the grooves 220 further include a third portion 223. The third portion 223 is parallel to and corresponding to the second gate electrode 121 of the second transistor. In a length direction of the third groove 223 (i.e., a first direction D1), a length of the third portion 223 is greater than a length of the second gate electrode 121, so as to effectively protect the second transistor 120 which severs as a pixel driving transistor. For example, because a region covered by a gate electrode in the semiconductor layer 240 is generally used as a channel region of a transistor, the third portion 223 of the grooves is disposed to have a length greater than the length of the second gate electrode 121 in the first direction D1, that is, greater than a length of the channel region of the second transistor 120, which can effectively protect the channel region.

For example, different portions of the grooves 220 may have different depths and may be flexibly designed according to the actual available space, which is not limited in the embodiments of the present disclosure.

In some examples, for example, the grooves 220 may form a square shape around the second gate electrode 121. Due to the existence of the semiconductor layer 240, the grooves 220 may have a shallow depth at a position overlapping the semiconductor layer 240 (relative to the base substrate). For example, the grooves 220 penetrate in the longitudinal direction until the surface of the semiconductor layer 240 so as to avoid damages to the semiconductor layer 240.

The above description of the grooves mainly takes the second transistor as an example. In the case where space is sufficient in the base substrate, each transistor in each pixel can be similarly arranged. For example, the above grooves are correspondingly provided around the gate electrode of each transistor.

For example, the gate electrode layer 250 is on a side of the second insulating layer 214 close to the base substrate 211.

For example, the first gate electrode 111 of the first transistor 110 is electrically connected to the gate line 71 through a first via 241 in the second insulating layer 214.

For example, in the direction perpendicular to the base substrate (referring to the direction D in FIG. 3), the gate electrode layer 250 may also be located between the first insulating layer 212 and the second insulating layer 214. For example, the first insulating layer 212 serves as a gate insulating layer of the first transistor 110 and the second transistor 120. The embodiments of the present disclosure are not limited thereto.

For example, a material of the gate electrode layer 250 may include gold (Au), silver (Ag), copper (Cu), aluminum (Al), molybdenum (Mo), magnesium (Mg), tungsten (W), and alloy materials composed of the above metals, or conductive metal oxide materials, such as indium tin oxide (ITO), indium zinc oxide (IZO), zinc oxide (ZnO), zinc aluminum oxide (AZO), and the like.

For example, a material of the semiconductor layer 240 includes, but is not limited to, silicon-based materials (amorphous silicon a-Si, poly-silicon p-Si, etc.), metal oxide semiconductors (IGZO, ZnO, AZO, IZTO, etc.), and organic materials (hexathiophene, polythiophene, etc.).

In some embodiments of the present disclosure, the first transistor 110 and the second transistor 120 are both top-gate structures. In other embodiments, the first transistor 110 and the second transistor 120 may also be bottom-gate structures. For example, the first transistor 110 is a top-gate structure, and the second transistor 120 is a bottom-gate structure. The top-gate type of transistor has a smaller parasitic capacitance so that it can have a higher turn-on speed; and the bottom-gate type of transistor has a larger on-state current and a higher electrical stability performance, thereby having a stronger driving ability. For example, the first transistor 110 and the second transistor 120 are thin film transistors. The embodiments of the present disclosure do not limit the specific structures or types of the first transistor 110 and the second transistor 120.

For example, the first transistor 110 includes a first source electrode 113 and a first drain electrode 114. For example, the first source electrode 113 or the first drain electrode 114 is electrically connected to the second gate electrode 121 of the second transistor 120.

For example, the first source electrode 113 and the first drain electrode 114 and the data line 61 are disposed in a same layer and are made of a same material, and thus can be manufactured through a same patterning process. For example, the first source electrode 113 or the first drain electrode 114 is electrically connected to the data line 61 to receive a data signal for emitting light. For example, the first source electrode 113 and the first drain electrode 114, of which is not electrically connected to the second gate electrode 121 of the second transistor 120, is electrically connected to the data line 61.

For example, the grooves 220 may further include a second portion 222 that is parallel to the data line 61 or overlaps the data line in a direction perpendicular to the base substrate 211. For example, a length direction of the second portion 222 is parallel to an extending direction of the data line 61 (as shown in FIG. 2).

For example, the array substrate 200 may further include a gate connection electrode 72. The gate connection electrode 72 is located between the gate electrode layer 250 and the first conductive pattern layer 213 for connecting the first gate electrode 111 and the gate line 71. In the case where a depth of the via hole is too deep, the conductive material filled in the via hole is likely to be wrinkled or fracture (especially in a bending state), resulting in excessive contact resistance or poor contact. By providing the gate connection electrode to connect the first gate electrode 111 and the gate line 71, the situation that a depth of a continuous via hole which directly connects the first gate electrode 111 and the gate line 71 is too deep may be avoided, therefore improving the yield and bending resistance of the array substrate.

For example, the gate connection electrode 72 may be provided in a same layer and formed of a same material as any one conductive layer between the gate electrode layer 250 and the first conductive pattern layer 213, and thus may be obtained through a same patterning process as the conductive layer.

For example, the gate connection electrode 72 is located between the second insulating layer 214 and the first conductive pattern layer 213. For example, the array substrate further includes a third insulating layer 216 disposed between the gate connection electrode 72 and the first conductive pattern layer 213. For example, the gate connection electrode 72 is electrically connected to the first gate electrode 111 through the first via hole 241 in the second insulating layer 214, and is electrically connected to the gate line 71 through a second via hole 261 in the third insulating layer 216, thereby electrically connecting the gate line 71 and the first gate electrode 111.

For example, the gate connection electrode 72 is provided in a same layer and formed of a same material as the first source electrode 113 and the first drain electrode 114 of the first transistor 110, and thus may be obtained through a same patterning process as the first source electrode 113 and the first drain electrode 114. For example, in a direction perpendicular to the base substrate, the third insulating layer 216 is located between the first conductive pattern layer 213 and the second source electrode 123 as well as the second drain electrode 124.

For example, the second transistor 120 further includes a second source electrode 123 and a second drain electrode 124. For example, the second source electrode 123 and the second drain electrode 124 are located between the second insulating layer 214 and the first conductive pattern layer 213. For example, the second source electrode 123, the second drain electrode 124, the first source electrode 113 and the first drain electrode 114 are all disposed in a same layer and formed of a same material, and thus may be obtained through a same patterning process.

For example, the light emitting element 300 includes a first electrode 301, a light emitting layer 302, and a second electrode 303. Here, the first electrode 301 is a pixel electrode, and the second electrode 303 is a common electrode. One of the first electrode 301 and the second electrode 303 is an anode, and the other is a cathode. For example, in at least one example, the light emitting element 300 may include at least one selected from the group consisting of a hole injection layer, a hole transport layer, an electron injection layer, an electron transport layer and the like in addition to the light emitting layer 302.

For example, the second source electrode 123 or the second drain electrode 124 of the second transistor 120 is electrically connected to the first electrode 301 (pixel electrode) of the light emitting element 300.

For example, the light emitting element 300 is located on a side of the first conductive pattern layer 213 away from the base substrate 211. For example, the array substrate 200 further includes a fourth insulating layer 218 located on the first conductive pattern layer 213, and the light-emitting element 300 is formed on the fourth insulating layer 218. The second source electrode 123 or the second drain electrode 124 of the second transistor 120 is electrically connected to the first electrode 301 of the light emitting element 300 through a third via hole 281 in the fourth insulating layer 218.

For example, the array substrate 200 further includes a driving connection electrode 230. The driving connection electrode 230 is located between the second source electrode 123 (or the second drain electrode 124) of the second transistor 120 and the pixel electrode of the light emitting element 300. The driving connection electrode 230 connects the second source electrode 123 (or the second drain electrode 124) of second transistor 120 and the pixel electrode of the light emitting element 300. In addition to the effect of reducing a depth of the via hole similar to the gate connection electrode 72, the driving connection electrode 230 may also increase the pixel distribution density of the array substrate 200 and reduce resistance between the second transistor 120 and the pixel electrode.

For example, as shown in FIG. 3, the driving connection electrode 230 and the groove 220 are overlapped in the direction perpendicular to the base substrate 221.

For example, as shown in FIG. 2, the driving connection electrode 230 is provided in a same layer and formed of a same material as the gate line 71, and thus may be obtained through a same patterning process as the gate line; that is, the first conductive pattern layer 213 further includes the driving connection electrode 230. The driving connection electrode 230 is electrically connected to the second source electrode 123 or the second drain electrode 124 of the second transistor 120 through a fourth via hole 264 in the third insulating layer 216, and is electrically connected to the first electrode 301 of the light emitting element 300 through the third via 281.

For example, the light emitting element 300 may be a top emission, a bottom emission, or a double emission structure. For example, in the case where the light emitting element 300 is a top emission structure, the first electrode 301 is reflective and the second electrode 303 is transmissive or semi-transmissive. For example, the first electrode 301 is of a transparent conductive oxide material such as indium tin oxide (ITO). For example, the first electrode 301 is of a material with a high work function to serve as an anode, such as an ITO/Ag/ITO laminated structure. The second electrode 303 is of a material with a low work function to serve as a cathode, such as a semi-transmissive metal or metal alloy material, such as an Ag/Mg alloy material.

For example, the third insulating layer 216 and the fourth insulating layer 218 are planarization layers. For example, the third insulating layer 216 and the fourth insulating layer 218 are both organic materials, such as resin like polyimide (PI).

For example, the array substrate 200 further includes a storage capacitor Cst, for example, for storing a data signal during the operation of the pixel circuit. The way of setting and connecting the storage capacitor can be adjusted according to the specific pixel circuit structure. For example, as shown in FIG. 3, a first capacitor electrode 411 of the storage capacitor is disposed between the first insulating layer 212 and the second insulating layer 214 in the direction perpendicular to the base substrate. A second capacitor electrode 412 is provided in a same layer and formed of a same material as the first gate electrode 111 of the first transistor 110 and therefore can be obtained through a same patterning process as the first gate electrode 111. The first capacitor electrode 411 and the second capacitor electrode 412 are facing each other to form the storage capacitor Cst.

For example, at least a portion of the grooves 220 is disposed between the second transistor 120 and the storage capacitor Cst with respect to a plane where the base substrate is located.

For example, the array substrate 200 further includes a pixel defining layer 215 disposed on the first electrode 301 of the light emitting element 300 so as to space apart light emitting layers of adjacent light emitting elements, thereby preventing cross-color during the display operation. An opening is formed in the pixel defining layer 215 at a position corresponding to the first electrode 301 to at least partially expose the first electrode 301, and the light emitting layer 302 is formed in the opening. The second electrode 303 is formed on the light emitting layer 302 and the pixel defining layer. For example, the pixel defining layer 215 is an organic material like resin or an inorganic material like silicon oxide.

For example, the array substrate 200 further includes a spacer layer 217 disposed on the pixel defining layer 215. For example, the spacer layer 217 is used to support the evaporation mask when the organic light emitting layer 302 is formed by evaporation, so as to space the pixel defining layer 215 apart from the evaporation mask to protect the pixel defining layer 215. The spacer layer 217 may further isolate adjacent organic light emitting layers. The spacer layer 217 generally includes a plurality of spacers, and a shape of the spacer is generally rectangular, cylindrical, spherical, hemispherical, and is not limited thereto.

For example, the array substrate 200 further includes a protective layer 219 disposed on the second electrode 303. The protective layer 219 is, for example, an inorganic protective layer or an organic protective layer, or a stack of an inorganic protective layer and an organic protective layer. In addition, the protective layer 219 may further include a reductive material and/or a hygroscopic material to avoid the adverse effect of oxygen/water vapor on the light emitting element 300.

For example, the array substrate 200 further includes a gate insulating layer 207 disposed between the gate electrode layer 250 and the semiconductor layer 240.

For example, a material of the gate insulating layer 207 is an oxide of silicon, a nitride of silicon, or an oxynitride of silicon.

For example, in at least one embodiment, the groove 220 further penetrates the gate insulating layer 207 to expose the base substrate 211.

For example, in a direction perpendicular to the base substrate, the array substrate 200 further includes a buffer layer (not shown) disposed between the base substrate 211 and the semiconductor layer 240. The buffer layer is used to planarize the surface of the base substrate 211, and prevent harmful impurities in the base substrate 211 from entering the pixel circuit. For example, the grooves 220 may expose the buffer layer without penetrating the buffer layer to expose the base substrate.

For example, the array substrate 200 is a flexible array substrate. For example, the base substrate 211 is an organic flexible material, such as polyimide (PI), polyethylene terephthalate (PET), polycarbonate, polyethylene, polyacrylate, polyetherimide, polyethersulfone, etc.

Figure 4:
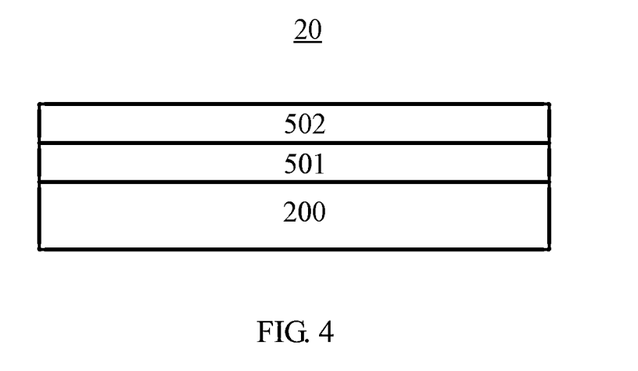
FIG. 4 is a schematic diagram of a display panel provided by an embodiment of the present disclosure.

As shown in FIG. 4, some embodiments of the present disclosure further provide a display panel 20 including the above-mentioned array substrate 200. For example, the display panel is an OLED display panel, and accordingly, the array substrate included therein is an OLED array substrate, and the light-emitting element included in the pixel unit is an OLED. For example, the display panel further includes an encapsulation layer 501 and a cover plate 502 disposed on the array substrate 200. The packaging layer 501 is configured to seal the light-emitting element 300 to prevent external moisture and oxygen from penetrating into the light-emitting element and the pixel circuit and causing damage to the device. For example, the encapsulation layer 501 includes an organic thin film or a structure in which an organic thin film and an inorganic thin film are alternately laminated. For example, a water-absorbing layer (not shown) may be further provided between the encapsulation layer 501 and the array substrate 200. The water-absorbing layer is configured to absorb water vapor or colloidal sol remaining in the light-emitting element 300 in the previous manufacturing process. The cover plate 502 is, for example, a glass cover plate. For example, the cover plate 502 and the packaging layer 501 may be in an integrated structure.

In another example, the display panel 20 is a liquid crystal display panel. The display panel 20 further includes a color filter substrate opposite to the array substrate and a liquid crystal layer disposed between the array substrate and the color filter substrate.

Some embodiments of the present disclosure also provide a display device including the above-mentioned array substrate or display panel. The display device may be, for example, a liquid crystal display device, an OLED display device or an electronic paper, a digital photo frame, a smart bracelet, a smart watch, a mobile phone, a tablet computer, a display, a notebook computer, a navigator, or other products or components having any display function.

Some embodiments of the present disclosure also provide a method for manufacturing an array substrate, the array substrate including a display pixel area for providing pixel units arranged in an array. The manufacturing method includes: providing a base substrate; forming a first insulating layer on the base substrate, and forming grooves in the first insulating layer, the grooves being formed in the display pixel area; forming a second insulating layer on the first insulating layer, and the second insulating layer is further filled into the grooves; and forming a first conductive pattern layer on the second insulating layer.

Figure 5:
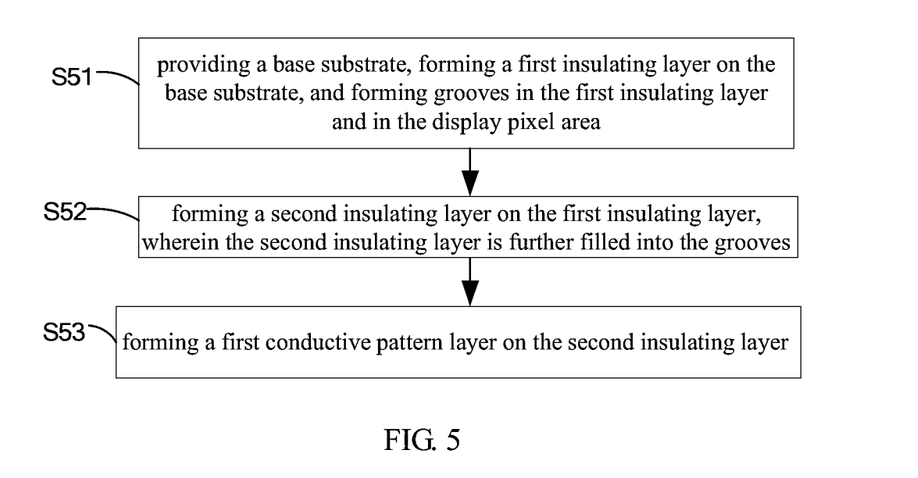
FIG. 5 is a flowchart of a method for manufacturing an array substrate provided by an embodiment of the present disclosure.

FIG. 5 is a flowchart of a method for manufacturing an array substrate according to an embodiment of the present disclosure. The manufacturing method of the array substrate provided by the embodiment of the present disclosure will be exemplarily described below with reference to FIG. 1, FIG. 3 and FIG. 5. The manufacturing method of forming the array substrate includes at least steps S51 to S53.

Step S51: providing a base substrate, forming a first insulating layer on the base substrate, and forming grooves in the first insulating layer, the grooves being formed in the display pixel area;

Step S52: forming a second insulating layer on the first insulating layer, wherein the second insulating layer is further filled into the grooves; and Step S53: forming a first conductive pattern layer on the second insulating layer.

In one example of step S51, a base substrate 211 is provided first, and then a first insulating layer 212 is formed on the base substrate 211 and grooves 220 are formed in the first insulating layer 212. For example, before the first insulating layer 212 is formed, the semiconductor layer 240, the gate insulating layer 207, and the gate electrode layer 250 are sequentially formed on the base substrate 211.

For example, the base substrate 211 is an organic flexible material, such as polyimide (PI), polyethylene terephthalate (PET), polycarbonate, polyethylene, polyacrylate, polyetherimide, polyethersulfone, etc.

For example, forming the gate electrode layer includes forming a first conductive layer and performing a patterning process on the conductive layer to form a first gate electrode 111 of the first transistor 110 and a second gate electrode 121 of the second transistor 120.

For example, the material of the first conductive layer is a metal material, such as copper, aluminum, magnesium, molybdenum, chromium, and alloys of the above metals.

For example, forming the grooves 220 include etching the first insulating layer 212.

For example, the grooves 220 do not overlap with the semiconductor layer 240 or the gate electrode layer 250 in a direction perpendicular to the base substrate 211.

For example, the grooves 220 also penetrate the gate insulating layer 207 to expose the base substrate 211.

For example, the first insulating layer 212 may be an organic insulating material, such as a resin material like polyimide. It may also be an inorganic insulating material, such as an oxide of silicon, silicon nitride or silicon oxynitride or metal oxide insulation.

For example, conventional processes like physical vapor deposition (such as forming a conductive layer), chemical vapor deposition (such as forming an insulating layer), spin coating (such as forming an organic layer), and photolithography (such as patterning) can be used during the formation process.

In an example of step S52, the material of the second insulating layer 212 is an organic insulating material, such as at least one of polymethyl methacrylate, polycarbonate, polystyrene, epoxy resin, polyimide and polyethylene. For example, the method for forming the second insulating layer 212 includes spin coating or ink-jet printing. For example, the method of forming the second insulating layer 212 further includes curing.

An organic insulating material has a better flexibility than an inorganic insulating material, so that the impact resistance and bending resistance of the array substrate 200 can be further improved.

For example, step S52 further includes etching the second insulating layer 214 to form a first via hole 241 and source and drain contact holes of the first transistors 110 and second transistors 120. The first via 241 also penetrates the first insulating layer 212 to expose at least a portion of the gate electrode layer 250. The source and drain contact holes further penetrate the first insulating layer 212 and the gate insulating layer 207 to expose at least a portion of the semiconductor layer 240 respectively.

In an example of step S53, the step further includes sequentially forming a second conductive layer and a third insulating layer 216 on the second insulating layer 214 before forming the first conductive pattern layer 213. For example, a patterning process is performed on the second conductive layer to form a first source electrode 113 and a first drain electrode 114 of the first transistor 110, and a second source electrode 123 and a second drain electrode 124 of the second transistor 120. For example, performing a patterning process on the second conductive layer further forms a gate connection electrode 72 and a data line 61. The gate connection electrode 72 is electrically connected to the first gate electrode 111 through the first via hole 241. The first source electrode 113 and the first drain electrode 114 of the first transistor 110 are in contact with the first active layer 112 through source and drain contact holes to form electrical connections. The second source electrode 123 and the second drain electrode 124 of the second transistor 120 are in contact with the second active layer 122 through source and drain contact holes to form electrical connections.

For example, step S53 further includes performing a patterning process on the third insulating layer 216 to form a second via hole 261 and a fourth via hole 262. The second via 261 hole exposes at least a portion of the gate connection electrode 72, and the fourth via hole 262 exposes at least a portion of the second source electrode 123 or the second drain electrode 124 of the second transistor 120.

For example, forming the first conductive pattern layer 213 includes forming a third conductive layer and performing a patterning process on the third conductive layer to form a gate line 71 and a driving connection electrode 230. The gate line 71 is electrically connected to the gate connection electrode 72 through the second via hole 261. The driving connection electrode 230 is electrically connected to the second source electrode 123 or the second drain electrode 124 of the second transistor 120 through the fourth via hole 262.

For example, the method for manufacturing the array substrate further includes forming a light emitting element 300 on the first conductive pattern layer 213, and forming the light emitting element 300 includes sequentially forming a first electrode 301, a light emitting layer 302, and a second electrode 303. The first electrode 301 is electrically connected to the driving connection electrode 230.

For example, the method for manufacturing the array substrate further includes forming a fourth insulating layer 218, a pixel defining layer 215, a spacer layer 217, and a protective layer 219, which will not be repeated herein.

For example, the material of the conductive layer may include gold (Au), silver (Ag), copper (Cu), aluminum (Al), molybdenum (Mo), magnesium (Mg), tungsten (W), and alloy materials composed of the above metals, or conductive metal oxide materials, such as indium tin oxide (ITO), indium zinc oxide (IZO), zinc oxide (ZnO), zinc aluminum oxide (AZO), and the like.

What has been described above is merely exemplary embodiments of the present disclosure, and is not intended to limit the protection scope of the present disclosure, which is determined by the appended claims.

What is claimed is:

1. An array substrate, comprising a display pixel area configured for providing pixel units arranged in an array, the array substrate further comprising:
   a base substrate;
   a first insulating layer, provided on the base substrate, and provided with grooves in the first insulating layer and in the display pixel area;
   a second insulating layer, provided on the first insulating layer and further filled into the grooves; and
   a first conductive pattern layer provided on the second insulating layer,
   wherein each of the pixel units comprises a light emitting element and a pixel circuit which drives the light emitting element to emit light, at least one of the pixel units comprises a first transistor and a second transistor, the first transistor comprises a first gate electrode disposed in a gate electrode layer, the second transistor comprises a second gate electrode disposed in the gate electrode layer, the grooves comprise a first groove, a second groove, a third groove and a fourth groove, the first groove is disposed between the first gate electrode of the first transistor and the second gate electrode of the second transistor, and the first groove and the third groove are respectively disposed on both sides of the second gate electrode along a second direction, the second groove and the fourth groove are respectively disposed on both sides of the second gate electrode along a first direction, the first direction and the second direction are perpendicular to each other, wherein, in a direction perpendicular to the base substrate, each of the grooves is disposed between the base substrate and a layer where a second drain electrode of the second transistor is disposed;

wherein the second drain electrode overlaps the first groove.

2. The array substrate according to claim 1, wherein a length direction of a groove in the grooves is parallel to a direction of a bending axis of the array substrate during bending.

3. The array substrate according to claim 1, wherein an extending direction of a groove in the grooves is parallel to an extending direction of the second gate electrode.

4. The array substrate according to claim 1, wherein a groove in the grooves extends along a curve.

5. The array substrate according to claim 1, further comprising:
a semiconductor layer, disposed on the base substrate; and
a gate insulating layer, disposed between the gate electrode layer and the semiconductor layer;
wherein the first insulating layer is disposed on the gate electrode layer, each of the grooves penetrates the first insulating layer and the gate insulating layer, and at least part of the grooves exposes the base substrate.

6. The array substrate according to claim 5, wherein each of the grooves is filled with organic materials, and the first insulating layer and the gate insulating layer are manufactured by inorganic materials.

7. The array substrate according to claim 1, wherein in the direction perpendicular to the substrate, a groove in the grooves has a different depth from another groove in the grooves.

8. The array substrate according to claim 1, further comprising a semiconductor layer disposed on the base substrate;
in the direction perpendicular to the substrate, a groove overlapped with the semiconductor layer in the grooves has a smaller depth than a groove not overlapped with the semiconductor layer in the grooves.

9. The array substrate according to claim 8, wherein the groove overlapped with the semiconductor layer penetrates from the first insulating layer until a surface of the semiconductor layer in the direction perpendicular to the substrate.

10. The array substrate according to claim 1, wherein the second transistor is a driving transistor, which is configured to provide a driving current for the light-emitting element.

11. The array substrate according to claim 1, wherein a length of the third groove in the first direction is greater than a length of the second gate electrode in the first direction.

12. The array substrate according to claim 1, wherein the pixel units are arranged in a plurality of rows and a plurality of columns, the array substrate further comprises a plurality of gate lines respectively connected to the plurality of rows of pixel units and a plurality of data lines respectively connected to the plurality of columns of pixel units;
a length direction of the second groove is parallel to an extending direction of a data line in the plurality of data lines.

13. The array substrate according to claim 1, wherein a length direction of the first groove is parallel to the gate line; or the first groove overlaps with the gate line in the direction perpendicular to the base substrate.

14. The array substrate according to claim 13, wherein
the first gate electrode is on a side of the second insulating layer close to the base substrate, and the first gate electrode is electrically connected to the gate line through a first via hole in the second insulating layer,
the array substrate further comprises a gate connection electrode, wherein the gate connection electrode is between the second insulating layer and the first conductive pattern layer, and the first gate electrode is electrically connected to the gate line through the gate connection electrode.

15. The array substrate according to claim 14, wherein the first transistor further comprises a first source electrode and a first drain electrode, a data line of the plurality of data lines is configured to provide an electric signal to part of the pixel units in the display pixel area; and
the first source electrode, the first drain electrode, the data line, and the gate connection electrode are in a same layer and made of a same material.

16. The array substrate according to claim 15, wherein the second gate electrode is connected to the first source electrode or the first drain electrode of the first transistor.

17. The array substrate according to claim 1, wherein the second transistor further comprises a second source electrode, and the array substrate further comprises a third insulating layer;
in the direction perpendicular to the base substrate, the second source electrode and the second drain electrode are between the second insulating layer and the first conductive pattern layer; and
in the direction perpendicular to the base substrate, the third insulating layer is between the first conductive pattern layer and the second source electrode as well as the second drain electrode.

18. The array substrate according to claim 17, further comprising a fourth insulating layer and a pixel electrode laminated on the first conductive pattern layer,
wherein the second source electrode or the second drain electrode is electrically connected to the pixel electrode through a second via hole in the fourth insulating layer;
the first conductive pattern layer further comprises a driving connection electrode; and the second source electrode or the second drain electrode is connected to the pixel electrode through the driving connection electrode.

19. A display panel comprising the array substrate according to claim 1.

* * * * *